United States Patent
Matsumoto et al.

(10) Patent No.: US 6,841,321 B2
(45) Date of Patent: Jan. 11, 2005

(54) METHOD AND SYSTEM FOR PROCESSING A SEMI-CONDUCTOR DEVICE

(75) Inventors: Shunichi Matsumoto, Yokohama (JP); Yasuhiro Yoshitake, Yokosuka (JP); Yoshiyuki Miyamoto, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 148 days.

(21) Appl. No.: 10/052,513

(22) Filed: Jan. 23, 2002

(65) Prior Publication Data

US 2002/0111038 A1 Aug. 15, 2002

(30) Foreign Application Priority Data

Jan. 26, 2001 (JP) ........................................ 2001-017887

(51) Int. Cl.⁷ .............................. G03C 5/00; G03F 9/00
(52) U.S. Cl. ............................ 430/30; 430/22; 430/312
(58) Field of Search ............................. 430/22, 30, 312

(56) References Cited

U.S. PATENT DOCUMENTS 5,451,479 A * 9/1995 Ishibashi ..................... 430/22
5,731,113 A * 3/1998 Ueno ........................... 430/22

OTHER PUBLICATIONS

Japanese Laid–open No. 07–211627, Aug. 11, 1995.
Japanese Laid–open No. 09–082607, Mar. 28, 1997.

* cited by examiner

*Primary Examiner*—Christopher G. Young
(74) *Attorney, Agent, or Firm*—Antonelli, Terry, Stout & Kraus, LLP

(57) ABSTRACT

A method and a system for processing a semiconductor device intended to improve the overlay accuracy of a semiconductor device product, particularly in its device area, in carrying out the mix-and-match exposure process are designed to calculate the difference of exposure distortions between two layers in the device area and the difference of exposure distortions between the two layers at the overlay measurement mark position from data of exposure field distortions of two exposure tools used for the mix-and-match exposure process and data of device area and overlay measurement mark position of the product, calculate a modification value which relates both differences to each other, calculate a first exposure condition correction value from the measurement result of overlay, and carry out the exposure process based on a second exposure condition correction value which is evaluated by modifying the first exposure condition correction value with the modification value.

14 Claims, 8 Drawing Sheets

METHOD AND SYSTEM FOR PROCESSING A SEMI-CONDUCTOR DEVICE

BACKGROUND OF THE INVENTION

The present invention relates to a method and system for processing (producing) a semi-conductor device, and particularly to a technique for improving the accuracy of overlay at the mix-and-match exposure process in which different exposure tools are used for different layers on a semiconductor substrate.

In the recent trends of higher integration and enhanced functioning of semiconductor devices, the production process is required to be much more accurate for accomplishing these demands. On the other hand, reduction of the production cost of semiconductor devices is another crucial subject.

In the production process of a semiconductor device, circuit patterns formed on exposure masks (will be termed simply "masks") are transferred on to a semiconductor wafer (will be termed simply "wafer") which is coated with photo-resist by using a projection exposure tool (apparatus). As a semiconductor device is made circuit patterns on multiple layers, the circuit pattern of one layer is performed an exposure process, i.e., an overlap exposure process on to the circuit pattern of the lower layer in the state of that the circuit pattern of one layer is registered to the circuit pattern of the lower layer.

The production line of semiconductor devices has the installation of multiple projection exposure tools in general, and there exists the disparity of accuracy among these projection exposure tools. On this account, when the mix-and-match exposure, the so-called overlap exposure is carried out among multiple exposure tools, the disparity of accuracy among the exposure tools is generated error among layers called "matching error" in a product of the semiconductor device.

A scheme of preventing the matching error is using the same projection exposure tool throughout all steps of semiconductor device production process; however, it results in a lower operation efficiency of projection exposure tools and increased production cost.

Although the mix-and-match exposure has limited applications that allow certain ranges of matching error, the expansion of its application is demanded strongly from the viewpoint of cost reduction. Therefore, it is a crucial technique to correct the matching error in carrying out the mix-and-match exposure.

Japanese patent publication No. Hei 7-211627 discloses a method of optimized overlap exposure, which is based on the formulation of aberration curves of lenses of projection exposure tools in approximate functions, the calculation of correction factors from the disparity of functions, and the correction of exposure condition.

Another Japanese patent publication No. Hei 9-82607 discloses an exposure method which is based on the correction of the overlay measurement result at exposure by using distortion data of objective lens in each of machining numbers of each exposure tool, and the adjustment of the projection magnification factor and the rotation of the projected image.

Both of the above-mentioned prior arts are intended to correct the entire exposure field of the exposure tools.

However, in the trends of higher integration and enhanced functioning of semiconductor devices, when the mix-and-match exposure is attempted without the investment for a huge facility providing many exposure tools in the production line of semiconductor devices, it is becoming difficult to keep the matching error within the allowable range throughout the entire exposure field.

What is crucial for semiconductor device products is the accuracy of overlay in the device area (area where circuit patterns for constructing semiconductor device are formed) where is smaller than the exposure field. The above-mentioned prior arts do not consider this affair.

SUMMARY OF THE INVENTION

With the intention of overcoming the foregoing problem, it is an object of the present invention to provide a method and system for processing a semi-conductor device which are capable of improving the overlay accuracy of device area at the mix-and-match exposure process thereby to upgrade the yield and productivity of semi-conductor devices in the trends of higher integration and enhanced functioning of semiconductor devices.

In order to achieve the above objective, the inventive semiconductor device production method and system are designed to correct field distortions of the projection exposure tools used for the mix-and-match exposure process based on the calculation of the exposure distortion in the device area which is smaller than exposure fields specific to individual products and individual exposing steps and the exposure distortion at the overlay measurement mark positions from device area coordinate data, overlay measurement mark position data, and exposure field distortion data of the exposure tools, the calculation of a modification value which relates both exposure distortions to each other, and the implementation of exposure by modifying with the modification value the exposure condition correction value which is calculated from the overlay measurement result. In consequence, it becomes possible to optimize the matching error correction in the device area based on the overlay measurement result.

The above-mentioned scheme can also correct formation errors of masks which are used for overlap exposure. Namely, the inventive semiconductor device fabrication method and system are designed to calculate the exposure distortion of the device area which is smaller than exposure fields specific to individual products and individual exposing steps and the exposure distortion at the overlay measurement mark positions from data of device area coordinates and overlay measurement mark positions and data of position error of the circuit pattern in the device area of masks used for overlap exposure and position error of the overlay measurement marks, calculate a modification value which relates both exposure distortions to each other, and carry out the exposure by modifying based on the modification value the exposure condition correction value which is calculated from the overlay measurement result.

By correcting both the field distortion data of the exposure tools and the mask forming error at the mix-and-match exposure process, the matching error can further be reduced. Namely, the inventive semiconductor device production method and system are designed to calculate the exposure distortion in the device area which is specific to each product and each exposing step and the exposure distortion at the overlay measurement mark positions from device area and overlay measurement mark position data, exposure field distortion data of the exposure tools used for mix-and-match exposure, and data of position error of the circuit pattern in the device area of the mask used for overlap exposure and position error of the overlay measurement marks of the mask, calculate a modification value which relates both exposure distortions to each other, and carry out the exposure by modifying with the modification value the exposure condition correction value which is calculated from the overlay measurement result.

The inventive semiconductor device production method and system are designed to assess the overlay accuracy based on the measurement result of the overlay mark positions modified with the above-mentioned modification value. In consequence, it becomes possible to infer the overlay accuracy of device area from the measurement result of overlay measurement mark positions.

The inventive semiconductor device production system, which is designed to correct field distortions of exposure tools at the mix-and-match exposure process, includes a memory unit which stores data of the device area and overlay mark positions of exposure layers of a semiconductor device, a memory unit which stores the history of exposure of the layers of the semiconductor device, a memory unit which stores field distortion data of the exposure tools, and a memory unit which stores the measurement results provided by an overlay measurement tool. The system further includes an unit for searching for data of device area and overlay measurement mark positions of an exposure layer at the exposure process of the layer of the semiconductor device, an unit for searching for exposure field distortion data of the exposure tool used for the immediate exposure layer and the exposure tool used for the former exposure layer, a unit for calculating the exposure distortion of the device areas in the immediate exposure layer and former exposure layer and the exposure distortion at the overlay measurement mark positions from the searched data of device area and overlay measurement mark positions and data of exposure field distortions of the exposure tool used for the immediate exposure layer and the exposure tool used for the former exposure layer, and an unit of calculating the difference between the immediate and former exposure layers of the calculated exposure distortions of the device area and the difference between the immediate and former exposure layers of the exposure distortions at the overlay measurement mark position thereby to evaluate a modification value which relates both differences to each other. The system further includes an unit for searching the overlay measurement results of the immediate and former exposure layers, an unit for calculating a first exposure condition correction value for the immediate exposure layer from the searched overlay measurement result, an unit for calculating a second exposure condition correction value by modifying the calculated first exposure condition correction value with the modification value, and an unit for releasing the calculated second exposure condition correction value.

These and other objects, features and advantages of the present invention will be apparent from the following description of preferred embodiments of invention taken in conjunction with the accompanying drawings.

DESCRIPTION OF THE PREFERRED EMBODIMENTS

Embodiments of the method and system for processing (producing) a semiconductor device based on this invention will be explained with reference to the drawings.

In producing a semiconductor device according to this invention, photo-resist is applied to the surface of a wafer, and a circuit pattern which is formed on a mask is transferred by a projection exposure tool (apparatus) on to the photo-resist-coated wafer, thereby a pattern of the first layer is exposed. Next, a mask pattern of photo-resist is formed on the wafer by developing the exposed first-layer pattern. A circuit pattern is formed on the wafer according as the wafer, with the photo-resist mask pattern being formed thereon, is rendered the etching process.

Next, an interlayer insulation film is formed on the circuit pattern of the wafer, and a thin film layer of wiring film material for forming a circuit pattern of the second layer is formed after several processing steps. The wafer having the formation of the thin film layer of wiring film material is rendered another application of photo-resist, and overlap exposure based on mix-and-match exposure for a second-layer circuit pattern is carried out by being overlaid to the first-layer circuit pattern.

The wafer, which has been rendered the overlap exposure, is developed to form a photo-resist mask pattern, and the second-layer circuit pattern which was overlaid on the first-layer circuit pattern is formed according as the thin film layer of wiring film material, with the photo-resist mask pattern being formed thereon, is rendered the etching process.

The following explains specifically the mix-and-match exposure process based on this invention.

First Embodiment

Figure 1:
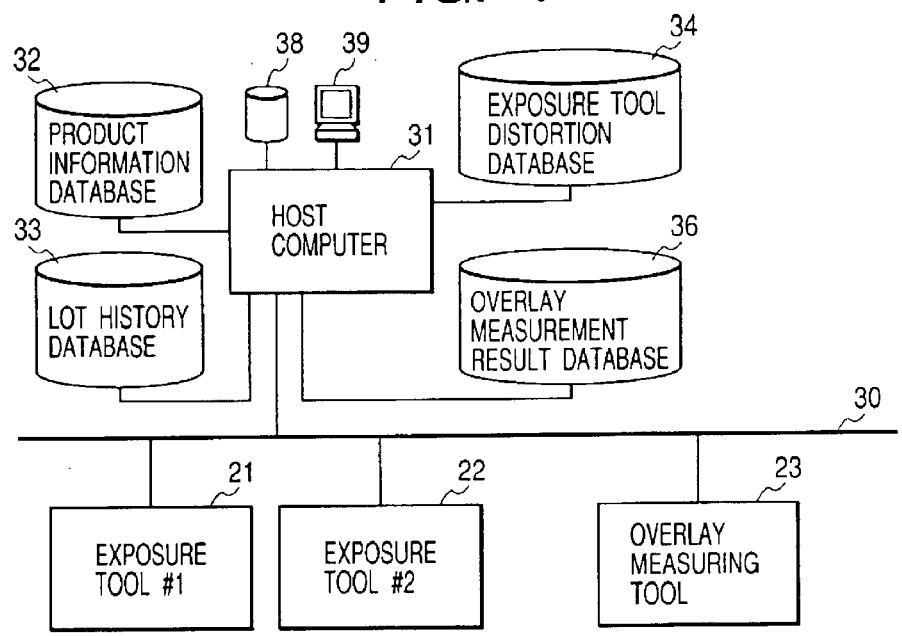
FIG. 1 is a brief block diagram showing the system construction based on a first embodiment of this invention.

First of all, explanation will be given on the first embodiment of the apparatus (system) for conducting matching error compensation upon exposure field strain in the exposure tool according to the present invention, by referring to FIGS. 1 and 5. In the figures, a reference numeral 31 is a host computer, in which various kinds of processing are executed. A reference numeral 32 is a product information database, holding and storing therein, design data such as device areas of the semiconductor device products and overlay measuring mark positions, etc., into which design information of the products (the semiconductor products) is inputted as the design information from a CAD system (not shown in the figure), for example, through a network 30.

A reference numeral 33 is a lot history database, holding and storing therein history data of indicating which one of the projection exposure tools (apparatuses) and which one of the masks are used in each of the steps, and is inputted from a production line management system (not shown in the figure) for managing the production line, for example, through the network 30. Of course, the lot history database 33 may be inputted from each of the projection exposure tools (apparatuses) 21, 22, etc., through the network 30. However, since the management upon the history with respect to the semiconductor wafers is executed in the production line management system, it is preferable to input it/them from the production line management system, for example, through the network 30.

Figure 7:
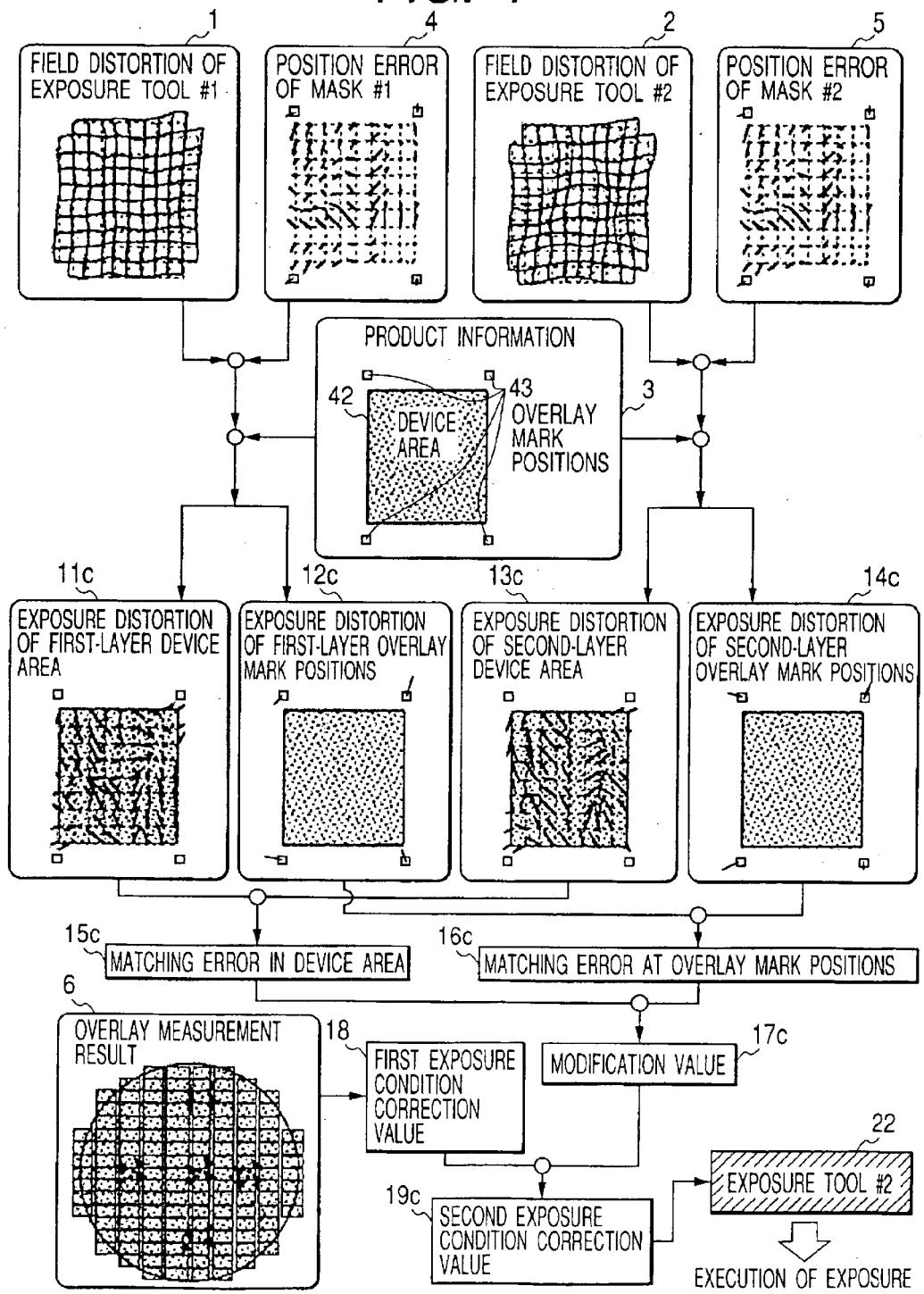
FIG. 7 is a flowchart used to explain the processes of the system shown in FIG. 3.

A reference numeral 34 is distortion database of each exposure tool indicating machining disparity (difference), holding and storing therein the measurement result of exposure field distortion indicative of the exposure distortion of the device area on each of the projection exposure tool (apparatus) (#1) 21 and the projection exposure tool (#2) 22. The distortion database of the projection exposure tools is stored exposure field distortion (calculated as grid shapes as shown in FIG. 5 and FIG. 7) indicating exposure distortion of device area acquired by following measurement method with inputting through an input means (not shown) or through the network 30. The measurement method comprises step of measuring coordinate positions of measurement reference patterns exposed them with each of the projection exposure tools (#1, #2) 21 and 22, by using a coordinate measuring unit (not shown), or measuring overlay of patterns by the overlay measuring tool (apparatus) 23 when each of the exposure tools (#1, #2) 21 and 22 is overlay exposed a pattern on a reference pattern which was formed on a reference wafer and beforehand, was measured coordinate.

A reference numeral 36 is overlay measurement result database 36 holding and storing the measurement result 6 measured an intended object (wafer), e.g., selected based on the lot, type or name, by the overlay measuring tool 23. The intended object is exposure result which has been actually rendered the overlap exposure with reference to overlap measurement marks 43 in each of the exposure tools (#1, #2) 21 and 22 in the past. The overlay measurement result 6 for each of the exposure tools stored as the database 36 can obtain as data of an exposure field 41 shown in FIG. 10 by measuring the object with the overlay measuring tool 23, the object being the result of exposure overlay exposed with reference to the overlay measurement marks 43 by each exposure tool.

As mentioned above, the overlay measurement result 6 for each exposure tool indicates errors (e.g., shift, rotation, magnification factor, etc.) for the exposure field 41 with reference to the overlay measurement marks 43, the errors having in each exposure tool itself.

Figure 5:
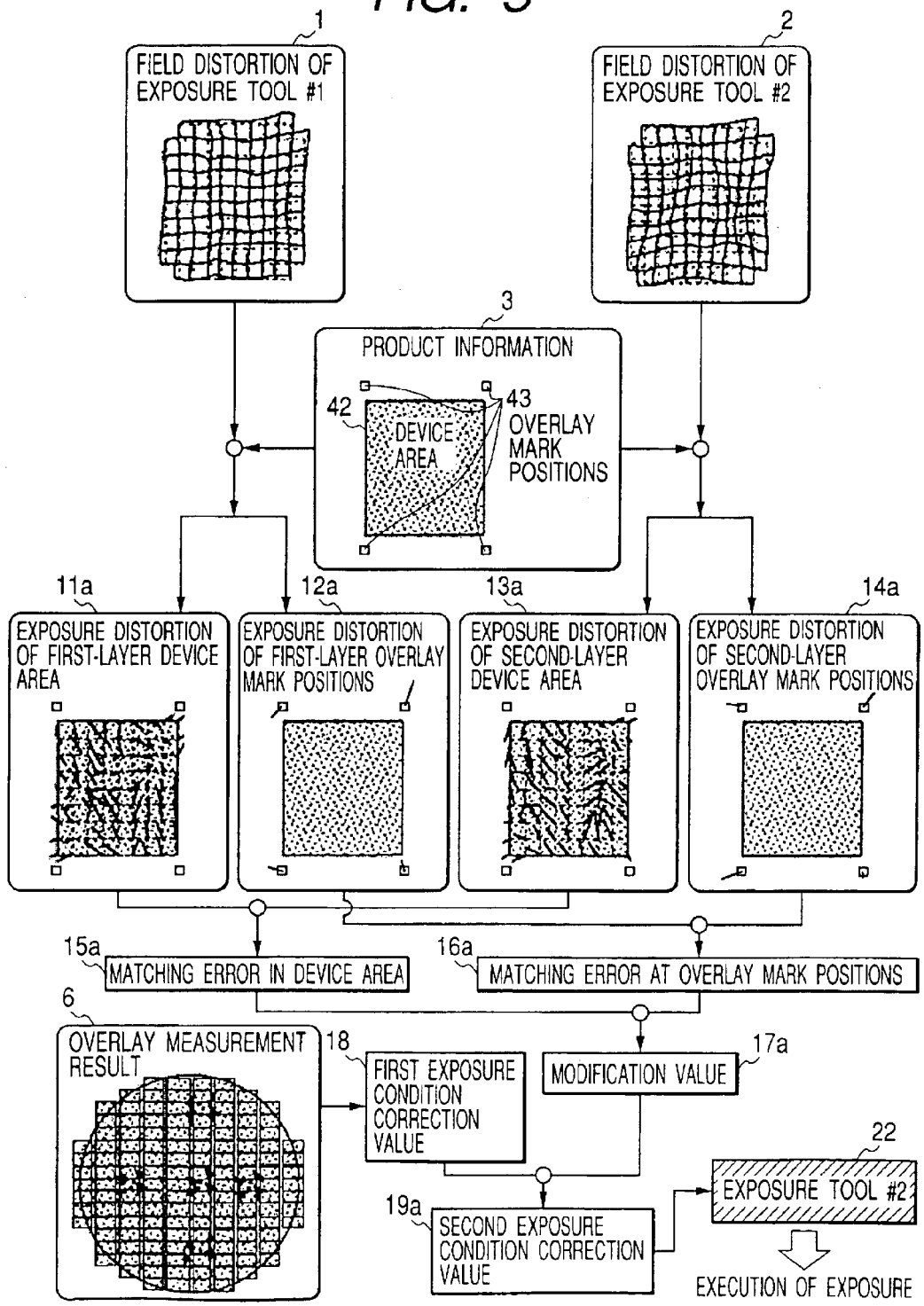
FIG. 5 is a flowchart used to explain the processes of the system shown in FIG. 1.
Figure 8:
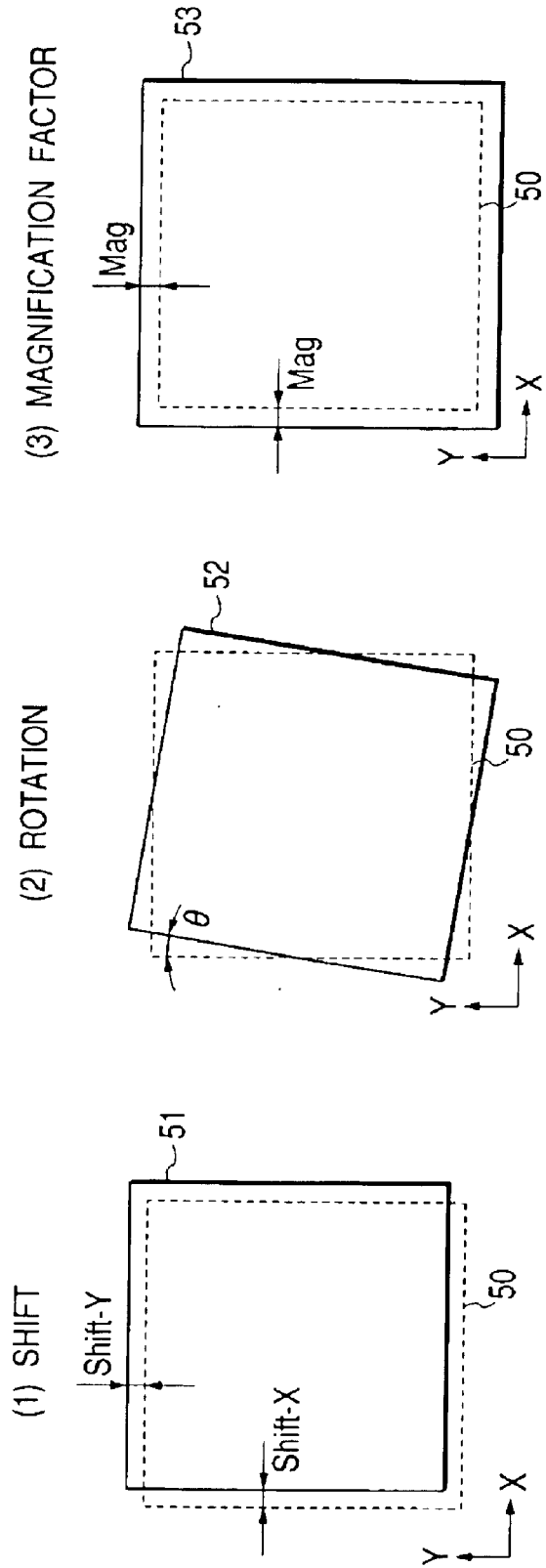
FIG. 8 is a diagram used to explain the parameters (first exposure condition correction values) which can be modified at the exposure process by the step-and-repeat exposure tool based on this invention.
Figure 9:
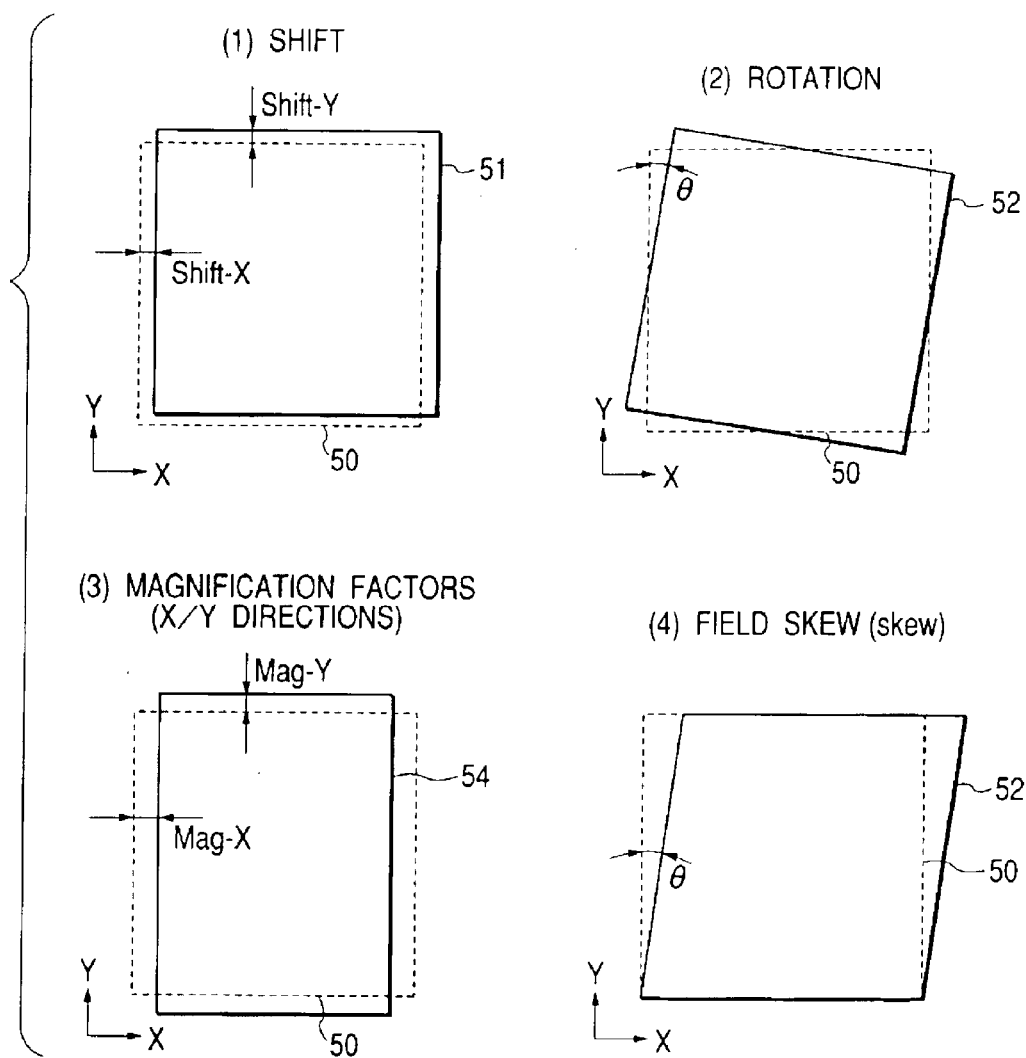
FIG. 9 is a diagram used to explain the parameters (first exposure condition correction values) which can be modified at the exposure process by the step-and-scan exposure tool based on this invention; and c

Therefore, a first exposure condition correction value 18 calculated on base of the overlay measurement result 6 as shown in FIG. 5 is formed as an offset value (calibration value) of a shift, rotation, magnification factor, etc. for exposing the reference exposure field 50 with reference to the overlay measurement marks 43 shown in FIG. 8 and FIG. 9.

The exposure tools (#1, #2) 21 and 22 are used for the mix-and-match exposure process. These exposure tools (#1, #2) 21 and 22 and the overlay measuring tool 23 are all connected to the host computer 31 through the network 30. The host computer 31 may be designed to function as a modification value calculating unit, first exposure condition correction value calculating unit, and second exposure condition correction value calculating unit. The first and second exposure condition correction value calculating unit may alternatively be included in the general controller of each exposure tool.

In carrying out the exposure on one layer of a semiconductor device, the host computer 31 searches the product information database 32 to get device area coordinate data and overlay measurement mark position data. The host computer 31 finds the exposure tool (#2) used for the one exposure layer (second layer) and the exposure tool (#1) used for the underlying exposure layer (former exposure layer, i.e., first exposure layer) based on the lot history database 33, and searches the exposure tool distortion database 34 to get exposure field distortion data (grid shapes) 2 and 1 as shown in FIG. 5 of the found exposure tools (#1, #2) 21 and 22.

The host computer 31 calculates exposure distortions 13a and 11a of the device area of the immediate exposure layer (second layer) and the former exposure layer (first layer) and exposure distortions 14a and 12a at the overlay measurement mark positions from the exposure field distortion data 2 and 1 of the found exposure tools (#1, #2) 21 and 22 based on the product information 3 (device area coordinate data and overlay measurement mark position data) taken out of the product information database 32, as shown in FIG. 5.

Figure 10:
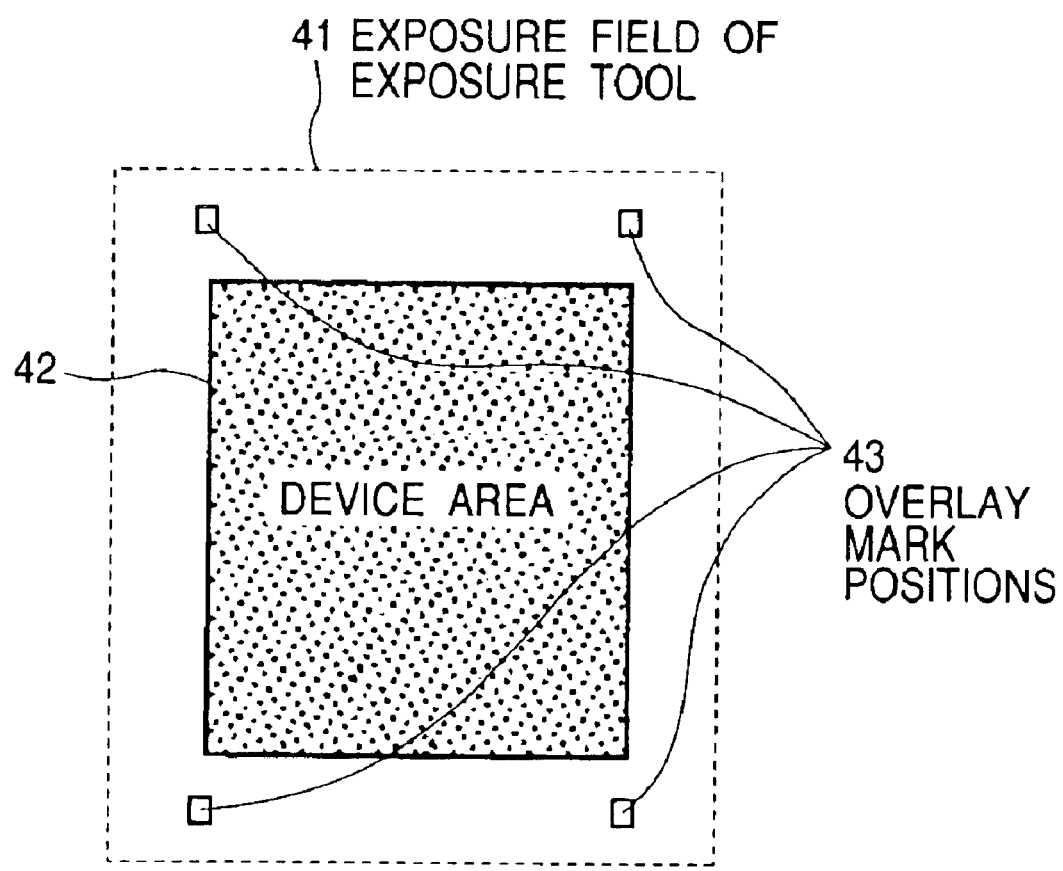
FIG. 10 is a diagram showing the positional relation among the exposure field of the exposure tool based on this invention and the device area and overlay measurement marks of a semiconductor device.

If the device area 42 is within the exposure field 41 of the exposure tool (#2) 22 as shown in FIG. 10, the exposure distortion 13a of the device area of the second layer shown in FIG. 5 can readily be calculated from the exposure field distortion data 2 of the exposure tool (#2) 22 based on the device-area coordinate data. Similarly, if the device area 42 is within the exposure field 41 of the exposure tool (#1) 21 as shown in FIG. 10, the exposure distortion 11a of the device area of the first layer shown in FIG. 5 can readily be calculated from the exposure field distortion data 1 of the exposure tool (#1) 21 based on the device area coordinate data.

As the positions of measurement of the exposure field distortion 2 of the exposure tool (#2) 22 do not necessarily coincide with the overlay measurement mark positions, the exposure distortion 14a at the overlay measurement mark positions of the second layer can be readily calculated by interpolating the exposure field distortion data 2 of the exposure tool (#2) 22 based on the overlay measurement mark position data. Similarly, as the positions of measurement of the exposure field distortion 1 of the exposure tool (#1) 21 do not necessarily coincide with the overlay measurement mark positions, the exposure distortion 12a at the overlay measurement mark positions of the first layer can be readily calculated by interpolating the exposure field distortion data 1 of the exposure tool (#1) 21 based on the overlay measurement mark position data.

As a result of the foregoing calculation of the host computer 31, the exposure distortion 13a of the second-layer device area and exposure distortion 14a at the second-layer overlay measurement mark positions caused by the exposure tool (#2) 22, and the exposure distortion 11a of the first-layer device area and exposure distortion 12a at the first-layer overlay measurement mark positions caused by the exposure tool (#1) 21 are stored in a memory 38.

Next, the host computer 31 evaluates the differences of the exposure distortion 13a of the second-layer device area and the exposure distortion 14a of the second-layer overlay measurement mark positions caused by the exposure tool (#2) 22 from the exposure distortion 11a of the first-layer device area and the exposure distortion 12a of the first-layer overlay measurement mark positions caused by the exposure tool (#1) 21 by reading out the distortion data from the memory 38 thereby to calculate the matching error 15a of the device area and matching error 16a of the overlay measurement mark positions indicative of the disparity between the exposure tool (#1) 21 and the exposure tool (#2) 22 shown in FIG. 5, and saves the calculation result in the memory 38.

The reason for the separation of the matching error 15a of device area and the matching error 16a of overlay measurement mark positions for the assessment of the difference of exposure distortions (matching error) between the exposure tool (#1) 21 and the exposure tool (#2) 22 is that the exposure distortion differs at positions inside the device area and at overlay measurement mark positions located in the periphery of device area, and that the exposure distortion is greater at the overlay measurement mark positions than inside the device area, while the present invention is intended to reduce drastically the matching error 15a in the device area.

It is also possible for the host computer 31 to display the matching error 15a of device area and matching error 16a of overlay measurement mark positions as the difference of exposure distortions (matching error) indicating machining difference between the exposure tool (#1) 21 and the exposure tool (#2) 22, on a display unit 39.

Next, the host computer 31 calculates each of correction parameters (e.g., shift, rotation, magnification factor, etc.) for the matching error 15a of device area and matching error 16a of overlay measurement mark positions saved in the memory 38. These correction parameters are linear, and the disparity between the exposure tools in terms of the relation of the matching error of device area to the matching error of overlay measurement mark positions is calculated as a modification value (shift, rotation, magnification factor, etc.) 17a by simply taking differences by the following formula (1) through (3) and stored in the memory 38. It is also possible for the host computer 31 to display the stored modification value (shift, rotation, magnification factor, etc.) 17a on the display unit 39.

It becomes possible for the host computer 31 to provide the exposure tool (#2) 22 for the second layer, for example, with the modification value (shift, rotation, magnification factor, etc.) 17 indicating the machining-difference between the exposure tools in the device area for the overlay measurement mark positions, stored in the memory 38 through the network 30, so that the exposure tool (#2) 22 calculates the second exposure condition correction value 19a by modifying the first exposure condition correction value 18 with the modification value 17a.

Modification value (shift)=(shift of device area)−(shift at overlay measurement mark positions)  (1)

Modification value (rotation)=(rotation of device area)−(rotation at overlay measurement mark positions)  (2)

Modification value (magnification factor)=(magnification factor of device area)−(magnification factor at overlay measurement mark positions)  (3)

Next, the manner of calculation of the first exposure condition correction value 18 implemented by the host computer 31 or the exposure tool (#1) 21 or (#2) 22 based on the overlay measurement result 6 which is derived from the actual exposure by positioning with reference to the overlay measurement marks by the exposure tools 21 and 22 will be explained. The overlay measurement result 6 is obtained from the overlay measuring unit 23 by measuring the object (wafer) which has been rendered the exposure by being positioned with reference to the overlay measurement marks by the exposure tools (#1, #2) 21 and 22, and it is stored in the overlay measurement result database 36 through the network 30. Accordingly, it is also possible to provide the exposure tools (#1, #2) 21 and 22 through the network 30 with the overlay measurement result 6 which is the actual exposure result (actual exposure result based on the positioning with reference to the overlay measurement marks) stored in the overlay measurement result database 36.

The host computer 31 or the exposure tool (#2) 22 calculates the first exposure condition correction values 18 based on the overlay measurement result 6 which is the result of actual exposure by the exposure tool (#2) 22 by positioning with reference to the overlay measurement marks. The first exposure condition correction value 18 is an offset value (calibration value) of the shift, rotation, magnification factor, etc. for exposing the reference exposure field 50 shown in FIG. 8 and FIG. 9 with reference to the overlay measurement marks 43 by the exposure tool (#2) 22.

Next, the exposure condition correcting parameter for correcting the error inherent to each exposure tool (error of exposure with reference to the overlay measurement marks 43 with respect to the reference exposure field 50) will be explained in connection with FIG. 8 and FIG. 9. FIG. 8 shows exposure condition correcting parameters used by the step-and-repeat exposure tool. In the figure, indicated by 50 is the reference position of the exposure field 41 on the case of normal exposure. Indicated by 51 is a shifted exposure field 41 resulting from the actual exposure with reference to the overlay measurement marks 43, and it can be corrected by shifting the wafer stage of the exposure tool in the x direction (Shift-X) and y direction (Shift-Y).

Indicated by 52 is a exposure field 41 rotated by angle θ resulting from the actual exposure with reference to the overlay measurement marks 43, and it can be corrected by turning the wafer stage or mask stage of the exposure tool. Indicated by 53 is the exposure field 41 resulting from the actual exposure with reference to the overlay measurement marks 43 of the case of erroneous magnification factor, and it can be corrected by adjusting the magnification factor of the objective lens of exposure tool.

FIG. 9 shows exposure condition correcting parameters used by the step-and-scan exposure tool. The shift and rotation of exposure field are the same as explained on FIG. 8. Indicated by 54 is the result of actual exposure with reference to the overlay measurement marks 43 with different magnification factors of the exposure field 41 in the x direction (Mag-X) and y direction (Mag-Y). The step-and-scan exposure tool can correct this deformation by adjusting the magnification factor of the objective lens and the scanning distance. Indicated by 55 is a skew exposure field 41 resulting from the actual exposure with reference to the overlay measurement marks 43, and it can be corrected by inclining the scanning direction.

As mentioned above, the host computer 31 or the exposure tool (#2) 22 calculates the first exposure condition correction value 18 based on the measurement result 6 of the past stored in the overlay measurement result database 36, and stores in the memory 38. Next, the host computer 31 or the exposure tool (#2) 22 calculates the second exposure condition correction value 19 for optimizing the overlap of device area by the exposure tool (#2) 22 as a sum of the foregoing first exposure condition correction value 18 and the modification value 17a (matching error indicative of the disparity of exposure tools in the device area with respect to the overlay measurement mark positions) by the following formulas (4) through (6).

Second exposure condition correction value (shift)=First exposure condition correction value (shift)+modification value (shift)  (4)

Second exposure condition correction value (rotation)=First exposure condition correction value (rotation)+modification value (rotation)  (5)

Second exposure condition correction value (magnification factor)=First exposure condition correction value (magnification factor)+modification value (magnification factor)  (6)

The calculated second exposure condition correction value 19a is fed to the controller of the exposure tool (#2) 22, which then carries out the exposure of the second layer under the calibration correction control with reference to the overlay measurement marks 43 by the controller, and it becomes possible to carry out the mix-and-match exposure with the optimized overlap in the device area 42.

The exposure field distortion of exposure tool varies depending on the position in the exposure field, and the overlay accuracy measured based on the overlay measurement marks is not necessarily consistent with the overlay accuracy of device area. The exposure field distortions of exposure tools are invariable, although they are specific to individual exposure tools. These distortions are measured in advance as data 1 and 2, and the exposure distortions 12a and 14a at the overlay measurement marks and exposure distortions 11a and 13a of the device area are predicted by calculation from the data 1 and 2 thereby to evaluate the matching error 16a at the overlay measurement marks and the matching error 15a of the device area. The exposure condition correction value 18 derived from the overlay measurement result 6 is modified based on these matching errors, and in consequence it becomes possible to optimize the matching error correction in the device area 42 even in the case of carrying out the mix-and-match exposure with different exposure tools for different layers on a substrate.

The positions of overlay measurement marks are different among the kinds (types/names) of semiconductor chips (semiconductor products), and even different among the processing steps of one kind of semiconductor product. Therefore, it is necessary to modify the exposure condition correction value precisely for each semiconductor product and each processing step. Based on this scheme, it becomes possible to improve the accuracy of matching error correction even in the case of mix-and-match exposure.

As described above, the device area 42 of a semiconductor product does not necessarily occupy the entire exposure field 41 of the exposure tool and, in addition, it differs depending on the kind of semiconductor product. Accordingly, by limiting the range of matching error correction of exposure field distortion within the device area in correspondence to individual semiconductor products, it becomes possible to optimize the correction of exposure condition for each semiconductor product even in the case of carrying out the mix-and-match exposure. Since the exposure field distortion of exposure tool is large in the edge section of exposure field, the effect of accuracy improvement will increase by the matching error correction in the device area excluding the edge section.

Following the correction of exposure condition in this manner, the exposure tool (#2) 22 is used to carry out the exposure of the second layer, and the exposure of high overlay accuracy, i.e., smaller matching error with respect to the first-layer exposure pattern, in the device area can be accomplished across the whole wafer surface.

Second Embodiment

Figure 2:
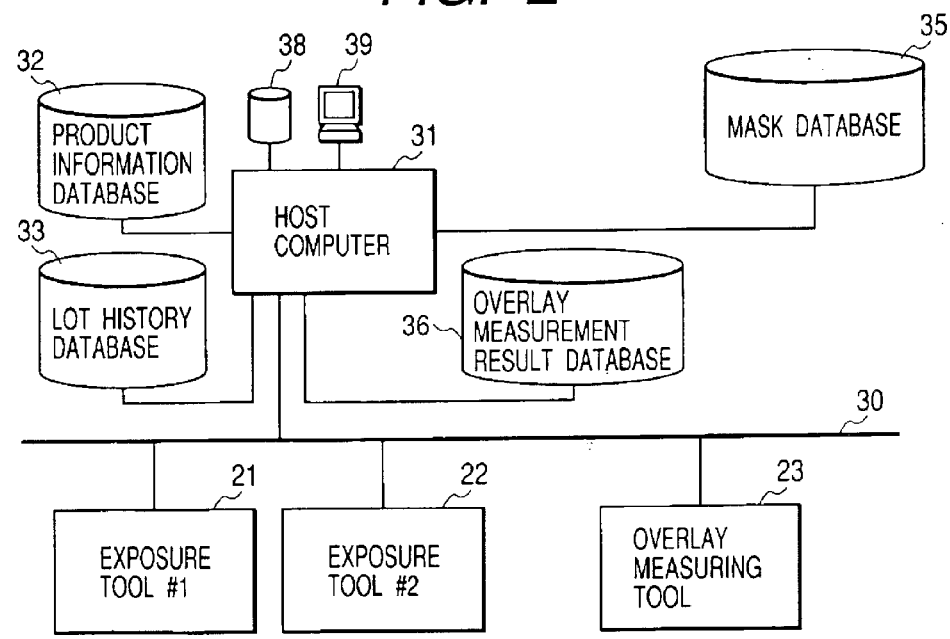
FIG. 2 is a brief block diagram showing the system construction based on a second embodiment of this invention.

Next, the second embodiment of invention which pertains to a system for matching error correction for the masks fitted to the exposure tools will be explained with reference to FIG. 2 and FIG. 6.

This embodiment differs from the first embodiment in that a mask accuracy database 35 which stores patterns of device area on the masks and the measurement result of position error of overlay measurement marks is installed in place of the exposure tool distortion database 34. In carrying out the exposure of one layer (second layer) of a semiconductor device, the host computer 31 searches the mask accuracy database 35 to get data 5 and 4 of patterns of device area and position error of overlay measurement marks of the mask to be used for the immediate layer (second layer) and the mask which has been used for the former layer (first layer) based on the coordinate data of the device area 42 and position data of the overlay measurement marks 43 taken out as product information 3 from the product information database 32 based on the kind (type/name) of the semiconductor device to be processed, as shown in FIG. 6. The host computer 31 calculates the exposure distortions 13b and 11b of the device area and exposure distortions 14b and 12b at the overlay measurement mark positions of the second and first layers from the taken-out data 5 and 4.

The host computer 31 calculates the matching error 15b of the device area indicative of the disparity of masks in the device area based on the calculated exposure distortion 13b of the device area of the second layer and the exposure distortion 11b of the device area of the first layer, calculates the matching error 16b at the overlay measurement mark positions indicative of the disparity of masks at the overlay measurement mark positions based on the exposure distortion 14b at the overlay measurement mark positions of the second layer and the exposure distortion 12b at the overlay measurement mark positions of the first layer, and calculates the modification values (matching errors) 17b indicative of the disparity of masks in the device area with respect to the overlay measurement mark positions and indicative of the relation between the calculated matching errors 15b and 16b.

The host computer 31 searches the overlay measurement result database 36 to get the overlay measurement result 6 of the exposure tool (#2) 22 which has the mask (#2) for the exposure of the second layer, and calculates the first exposure condition correction value (offset value, e.g., shift, rotation, magnification factor, etc.) 18 for the exposure of the reference exposure field 50 based on the taken-out overlay measurement result 6, as in the case of the first embodiment. Next, the host computer 31 calculates a second exposure condition correction value 19b by modifying the calculated first exposure condition correction value 18 with the modification value (matching error) 17b indicative of the disparity of masks in the device area with respect to the overlay measurement mark positions, and delivers the second exposure condition correction value 19b to the exposure tool (#2) 22 which carries out the exposure of the second layer.

The exposure tool (#2) 22 modifies the exposure condition with the second exposure condition correction value 19b, and thereafter carries out the exposure of the second layer of the semiconductor device.

Figure 6:
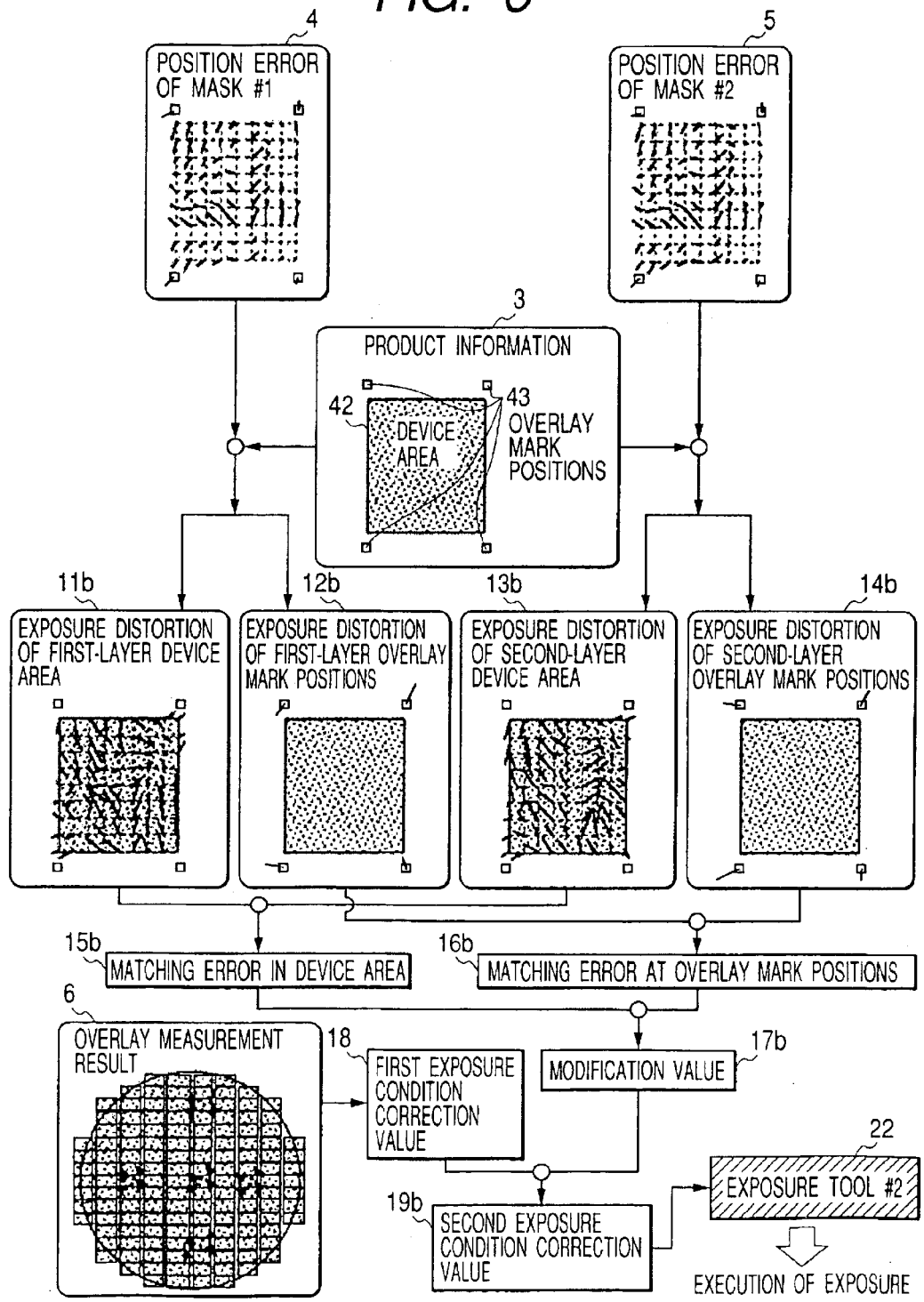
FIG. 6 is a flowchart used to explain the processes of the system shown in FIG. 2.

In consequence, it becomes possible to arrange the system which carries out automatically the processes shown in FIG. 6. In the figure, indicated by 4 is the position error of the circuit pattern in the device area and the position error of the overlay measurement marks on the mask used for the exposure of the first layer, and 5 is the position error of the circuit pattern in the device area and the position error of the overlay measurement marks on the mask used for the exposure of the second layer. These position errors 4 and 5 can be obtained by measuring the pattern and marks on the mask with the coordinate measuring unit and comparing the measured values with the design data. The position error of the circuit pattern in the device area may be either based on the measurement of the actual device pattern or based on the measurement of a dummy pattern which is placed in the device area. The subsequent processes are the same as explained on FIG. 5.

The host computer 31 gets the exposure distortions (11b, 12b, 13b, 14b) caused by the mask from the product information 3 and the position errors 4 and 5 of the mask, calculates the matching error 15b (of the mask) in the device area and the matching error 16b (of the mask) at the overlay measurement mark positions, and takes the difference of correction parameters to evaluate a modification value 17b. The host computer 31 or the exposure tool (#2) 22 calculates the second exposure condition correction value 19b by modifying the first exposure condition correction value 18, which is calculated from the past overlay measurement result 6 of the exposure tool (#2) 22 having the mask #2, with the modification value 17b, and sets the calculated second exposure condition correction value 19b to the exposure tool (#2) 22 having the mask #2 and carries out the exposure.

The exposure field distortions caused by the masks are invariable, although they are specific to individual masks. These distortions are measured in advance as data 4 and 5, and the exposure distortions 12b and 14b at the overlay measurement marks and exposure distortions 11b and 13b of the device area are predicted by calculation from the data 4 and 5 thereby to evaluate the matching error 16b at the overlay measurement marks and the matching error 15b of the device area. The exposure condition correction value 18 derived from the overlay measurement result 6 is modified with these matching errors, and in consequence it becomes possible to optimize the matching error correction in the device area 42 even in the case of carrying out the mix-and-match exposure by use of different masks for different layers on the substrate.

Third Embodiment

Next, the third embodiment of invention which pertains to a system for matching error correction against the exposure field distortion of exposure tools and the masks fitted to the exposure tools will be explained with reference to FIG. 3 and FIG. 7. This embodiment combines the first and second embodiments for dealing with the disparity among the masks as well as among the exposure tools encountered in the mix-and-match exposure.

Figure 3:
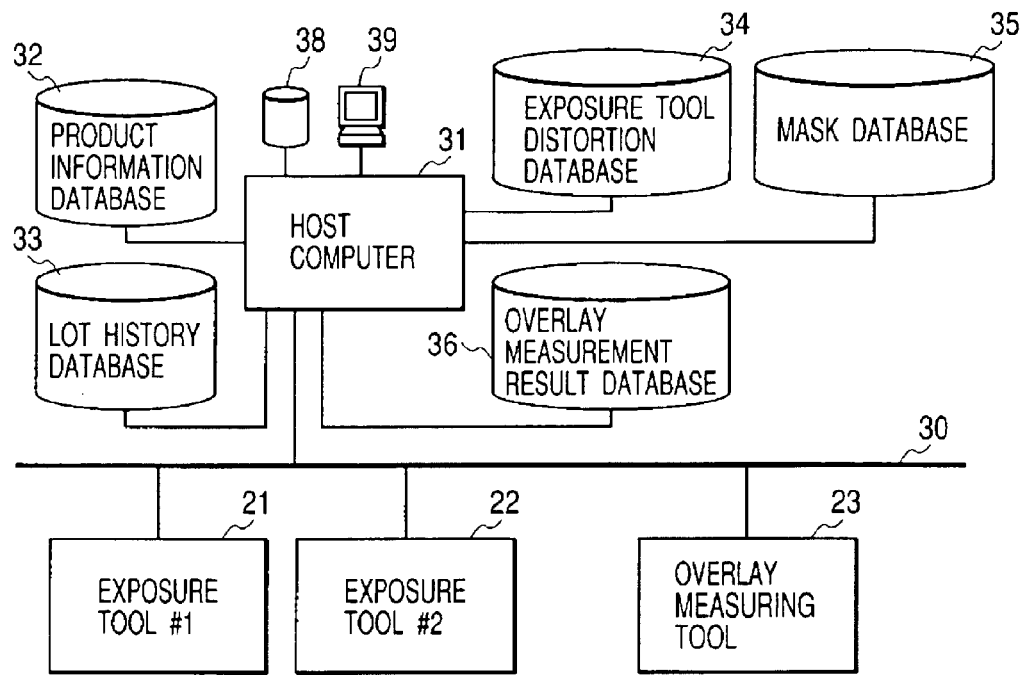
FIG. 3 is a brief block diagram showing the system construction based on a third embodiment of this invention.

FIG. 3 explains the system of implementing the matching error correction against the exposure field distortion of exposure tools and the masks. This embodiment differs from the first and second embodiments in that it includes both the exposure tool distortion database 34 shown in FIG. 1 and the mask accuracy database 35 shown in FIG. 2. In carrying out the exposure of one exposure layer (second layer) of a semiconductor device, as shown in FIG. 7, the host computer 31 searches the exposure tool distortion database 34 to get exposure field distortion data 2 and 1 of the exposure tool (#2) 22 used for the immediate layer (second layer) and the exposure tool (#1) 21 used for the former layer (first layer) based on the coordinate data of the device area 42 and the position data of the overlay measurement marks 43 taken out as product information 3 from the product information database 32 based on the kind (type/name) of the semiconductor device to be processed, and further searches the mask accuracy database 35 to get data 5 and 4 of the pattern of device area and position error of the overlay measurement marks used for the immediate layer (second layer) and the mask used for the former layer (first layer).

The host computer 31 calculates the exposure distortion 13c of the device area and the exposure distortion 14c at the overlay measurement mark positions of the exposure layer (second layer) from the taken-out data 2 and 5, and calculates the exposure distortion 11c of the device area and the exposure distortion 12c at the overlay measurement mark positions of the former exposure layer (first layer) from the taken-out data 1 and 4.

The host computer 31 further calculates the matching error 15c of device area indicative of the disparity among the exposure tools and masks in the device area based on the calculated exposure distortion 13c in the device area of the second layer and the exposure distortion 11c in the device area of the first layer, and calculates the matching error 16c at the overlay measurement mark positions indicative of the disparity among the exposure tools and masks based on the calculated exposure distortion 14c at the overlay measurement mark positions of the second layer and the exposure distortion 12c at the overlay measurement mark positions of the first layer.

The host computer 31 calculates a modification value (matching error indicative of the disparity among the exposure tools and masks in the device area with respect to the overlay measurement mark positions) 17c which relates both matching errors (matching errors in the device area and at overlay measurement mark positions) 15c and 16c to each other.

Following the correction of exposure condition, the exposure tool (#2) 22 is used to carry out the exposure of the second layer, and the exposure of high overlay accuracy, i.e., smaller matching error with respect to the first-layer exposure pattern, in the device area can be accomplished across the whole wafer surface.

The host computer 31 searches the overlay measurement result database 36 to get the overlay measurement result 6 of the exposure tool (#2) 22 which is about to carry out the exposure of the second layer, and calculates a first exposure condition correction value (offset value, e.g., shift, rotation, magnification factor, etc.) 18 for the exposure of the reference exposure field 50 based on the taken-out overlay measurement result 6, as in the cases of the first and second embodiments.

Next, the host computer 31 calculates a second exposure condition correction value 19c by modifying the calculated first exposure condition correction value 18 with the modification value (matching error) 17c indicative of the disparity among the exposure tools and masks in the device area with respect to the overlay measurement mark positions, and delivers the second exposure condition correction value 19c to the exposure tool (#2) 22 which carries out the exposure of the second layer.

The exposure tool (#2) 22 modifies the exposure condition with the second exposure condition correction value 19c, and thereafter carries out the exposure of the second layer of the semiconductor device.

In consequence, it becomes possible to arrange the system which carries out automatically the processings shown in FIG. 7. In this case, the exposure distortions (11c,12c,13c, 14c) are sums of the exposure field distortions (1,2) and mask position errors (4,5). Although the measurement positions of exposure field distortion and the measurement positions of mask position error do not necessarily coincide, it is possible to calculate the sum of the exposure field distortion and the mask position error of the same positions based on the interpolation of one set of positions.

The subsequent processes are the same as explained on FIG. 5 and FIG. 6. The host computer 31 calculates the matching error 15c of the device area and the matching error 16c at the overlay measurement mark positions from the exposure distortions (11c,12c,13c,14c), and takes the difference of correction parameters to evaluate a modification value (matching error) 17c indicative of the disparity among the exposure tools and masks in the device area with respect to the overlay measurement mark positions.

The host computer 31 calculates a second exposure condition correction value 19c by modifying the first exposure condition correction value 18, which is calculated from the overlay measurement result 6, with the modification value 17c, and sets the calculated second exposure condition correction value 19c to the exposure tool (#2) 22 to carry out the exposure.

The exposure field distortions caused by the exposure tools and masks are invariable, although they are specific to individual exposure tools and masks. These distortions are measured in advance as data 1,2,4 and 5, and the exposure distortions 12c and 14c at the overlay measurement marks and exposure distortions 11c and 13c of the device area are predicted by calculation from the data 1,2,4 and 5 thereby to evaluate the matching error 16c at the overlay measurement marks and the matching error 15c of the device area. The exposure condition correction value 18 derived from the overlay measurement result 6 is modified with these matching errors, and in consequence it becomes possible to optimize the matching error correction in the device area 42 even in the case of carrying out the mix-and-match exposure by use of different exposure tools and masks for different layers on the substrate.

Following the correction of exposure condition, the exposure tool (#2) 22 is used to carry out the exposure of the second layer, and the exposure of high overlay (registration) accuracy, i.e., smaller matching error with respect to the first-layer exposure pattern, in the device area can be accomplished across the whole wafer surface.

Fourth Embodiment

Figure 4:
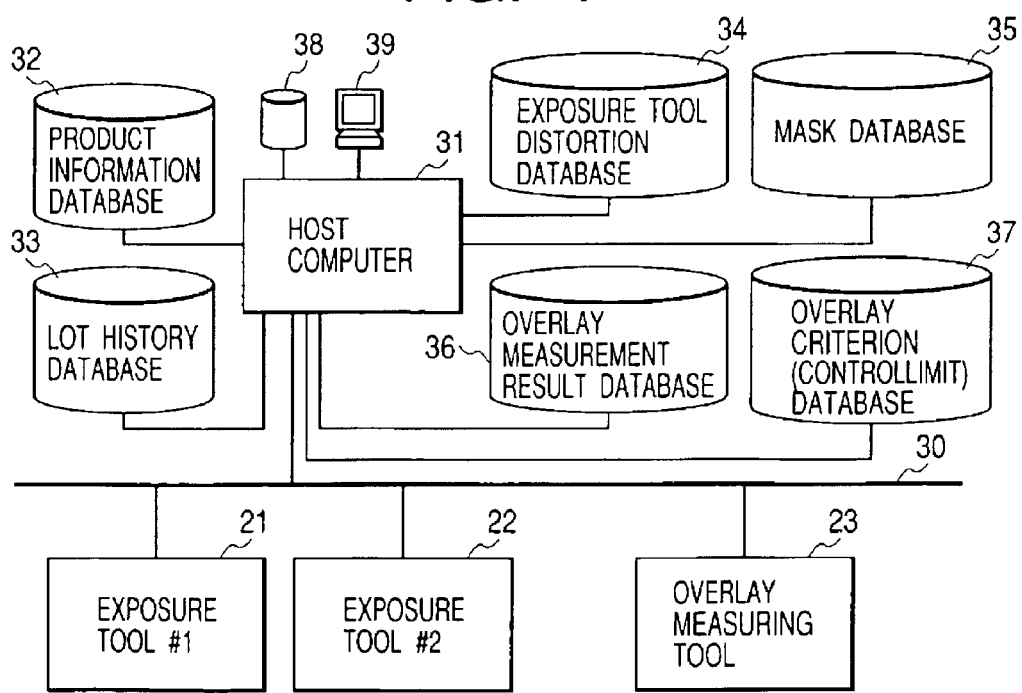
FIG. 4 is a brief block diagram showing the system construction based on a fourth embodiment of this invention.

Next, the fourth embodiment of invention which pertains to a system for matching error correction against the exposure field distortion of exposure tools and the masks fitted to the exposure tools will be explained with reference to FIG. 4. The figure explains the system which implements the assessment of overlay based on the assessment value for the device area. An overlay criterion database 37 stores overlay criterion (control limit) values of semiconductor devices.

The host computer 31 searches the exposure tool distortion database 34 to get exposure field distortion data 2 and 1 of the exposure tool (#2) 22 used for the immediate layer (second layer) and the exposure tool (#1) 21 used for the former layer (first layer) based on the coordinate data of the device area 42 and the position data of the overlay measurement marks 43 taken out as product information 3 from the product information database 32 based on the kind of the semiconductor device to be processed, and further searches the mask accuracy database 35 to get data 5 and 4 of the pattern of device area and position error of the overlay measurement marks used for the immediate layer (second layer) and the mask used for the former layer (first layer), in the same manner as the third embodiment.

The host computer 31 calculates the exposure distortion 13c of the device area and the exposure distortion 14c at the overlay measurement mark positions of the exposure layer (second layer) from the taken-out data 2 and 5, and calculates the exposure distortion 11c of the device area and the exposure distortion 12c at the overlay measurement mark positions of the former exposure layer (first layer) from the taken-out data 1 and 4.

The host computer 31 further calculates the matching error 15c of the device area indicative of the disparity among the exposure tools and masks in the device area based on the calculated exposure distortion 13c of the device area of the second layer and the exposure distortion 11c of the device area of the first layer, and calculates the matching error 16c at the overlay measurement mark positions indicative of the disparity among the exposure tools and masks based on the calculated exposure distortion 14c at the overlay measurement mark positions of the second layer and the exposure distortion 12c at the overlay measurement mark positions of the first layer. The host computer 31 calculates a modification value 17c which relates both matching errors 15c and 16c to each other.

Furthermore, in this embodiment, the host computer 31 or the exposure tool (#2) 22 calculates an inferred value of overlay in the device area from the modification value 17c by modifying directly the matching error of the exposure field 41 resulting from the actual exposure measured by the overlay measuring tool 23, and stores the calculated inferred value of overlay of device area as an assessment value of overlay in the memory 38 or a memory of the exposure tool (#2) 22. In consequence, it becomes possible to display as an assessment value the inferred error of overlapping in the device area at the exposure process of the second layer with the exposure tool (#2) 22 over the first layer on the display unit 39 or a display screen of the exposure tool (#2) 22. The modification value 17c may be displayed at the same time on the display unit 39 or the display screen of the exposure tool (#2) 22.

The host computer 31 or the exposure tool (#2) 22 further searches the overlay criterion database 37 depending on the kind (type/name) and processing step of the semiconductor product to get the overlay criterion value of device area in the immediate processing step of the semiconductor product, compares the taken-out overlay criterion value of device area with the criterion value which has been calculated and stored previously thereby to judge the approval of overlay (registration), and stores the result in the memory 38 or the memory of the exposure tool (#2) 22. The judgment result of overlapping of device area resulting from the exposure of the second layer over the first layer is displayed on the display unit 39 or the display screen of the exposure tool (#2) 22, or sent through the network 30 and displayed on a display unit of the production line management system, so that further modification or the selection of a proper exposure tool or mask is made possible.

In consequence, it becomes possible to accomplish a system which carries out automatically the judgment of overlapping, which is much closer to the performance of semiconductor device product than using the result of measurement of the overlay measurement marks (outside of device area).

The first through third embodiments are intended to optimize the overlay of device area for the mix-and-match exposure process based on the prior calculation of the matching errors 15 and 16 caused by the disparity among the exposure tools in the device area and mark positions, the evaluation of the modification value 17 which indicates their relation, and the correction of the exposure condition 18, which is calculated from the overlay measurement result 6, with the modification value 17.

According to the fourth embodiment, in which the overlay measurement result 6 is modified directly with the modification value 17, it is possible to infer the overlay accuracy of device area based on the overlay measurement result 6. With the inferred value being used as assessment value, it becomes possible to implement the assessment of overlay more practically than using the measurement result of overlay measurement marks (outside of device area). For example, based on the comparison between the overlay criterion value of device area and the assessment value, the judgment of approval of overlay can be much closer to the performance of semiconductor device product.

According to the present invention, the modification value of exposure condition is calculated in correspondence to the exposure field range which differs depending on each product and the overlay measurement mark positions which differ depending on each product and processing step based on field distortion data of each exposure tool, and the exposure condition correction value resulting from the overlay measurement result is modified with the modification value, and in consequence it is possible to improve the overlay accuracy of device area at the mix-and-match exposure process and improve the yield and productivity of semiconductor devices.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of processing a semiconductor device comprising the steps of:

applying photo-resist to a surface of a substrate to be processed;

rendering exposure of first layer overlay marks and a first layer circuit pattern to the substrate coated with the photo-resist by using a first exposure tool which is fitted up with a first mask;

processing the substrate, which has been rendered with the exposure of the first layer overlay marks and the first layer circuit pattern, to form thereon first layer overlay marks and a first layer circuit pattern;

applying photo-resist to the surface of the substrate on which the first layer overlay marks and the first layer circuit pattern have been formed;

rendering exposure of second layer overlay marks and a second layer circuit pattern to the substrate coated with the photo-resist by using a second exposure tool which is fitted up with a second mask;

processing the substrate, which has been rendered with the exposure of the second layer overlay marks and the second layer circuit pattern, to form thereon second layer overlay marks and a second layer circuit pattern; and wherein said step of rendering the exposure of the second layer overlay mark and the second layer circuit pattern by using the second exposure tool fitted up with the second mask includes, beforehand, the steps of calculating matching error in circuit pattern areas between exposure distortions of first-layer and second-layer circuit pattern areas being smaller than an exposure field, calculating matching error at overlay mark positions between exposure distortions of first-layer and second-layer overlay mark positions, calculating a modification value which relates both said matching errors, calculating a first exposure condition correction value based on an overlay measurement result which is a result of actual exposure by said second exposure tool by positioning with reference to overlay marks, and modifying said calculated first exposure condition correction value with said modification value to obtain a second exposure condition correction value for rendering the exposure by using said second exposure tool.

2. A method of processing a semiconductor device according to claim 1, wherein information on the exposure distortion caused by the first exposure tool and information on the exposure distortion caused by the second exposure tool used in said step of rendering the exposure of the second overlay measurement mark and second pattern by using the second exposure tool fitted up with the second mask are stored in a memory in advance.

3. A method for processing a semiconductor device according to claim 1 further including the step of displaying information on the overlay accuracy between the first circuit pattern and the second circuit pattern.

4. A method of processing a semiconductor device according to claim 1, wherein said second exposure condition correction value to be modified in said step of rendering of the exposure of the second layer overlay mark and the second layer circuit pattern by using the second exposure tool fitted up with the second mask, includes any of positional shift, rotation and magnification factor of a second exposure field in reference to said second overlay marks.

5. A method of processing a semiconductor device according to claim 1, wherein said step of rendering the exposure of the second layer overlay marks and the second layer circuit pattern by using the second exposure tool fitted up with the second mask further includes the steps of calculating said exposure distortions of first-layer and second-layer circuit pattern areas and said exposure distortions of first-layer and second-layer overlay mark positions based on a first field distortion of said exposure field of said first exposure tool, a second field distortion of said exposure field of said second exposure tool and product information including data of circuit pattern area coordinate and overlay mark positions.

6. A method of processing a semiconductor device according to claim 1, wherein said step of rendering the exposure of the second layer overlay mark and the second layer circuit pattern by using the second exposure tool fitted up with the second mask further includes the steps of calculating said exposure distortions of first and second circuit pattern areas and said exposure distortions of first and second overlay mark positions based on a first field position error of said exposure field of said first mask, a second field position error of said exposure field of said second mask and product information including data of circuit pattern area coordinate and overlay mark positions.

7. A method of processing a semiconductor device according to claim 1, wherein said step of rendering the exposure of the second layer overlay mark and the second layer circuit pattern by using the second tool fitted up with the second mask includes further the steps of calculating said exposure distortions of the first circuit pattern area and said exposure distortions of the first overlay mark positions based on a first field distortion of said exposure field of said first exposure tool, a first field position error of said exposure field of said first mask and product information including data of circuit pattern area coordinate and overlay measurement mark positions, and calculating said exposure distortions of a second circuit pattern area and said exposure distortions of second overlay mark positions based on a second field distortion of said exposure field of said second exposure tool, a second field position error of said exposure field of said second mask and said product information.

8. A method of processing a semiconductor device according to claim 1, wherein said matching error in the circuit pattern area calculated in the steps of calculating matching error and said matching error at overlay mark positions calculated in the step of calculating matching error indicate disparity between said first and said second exposure tools or said first and said second masks.

9. A method of processing a semiconductor device comprising the steps of:

applying photo-resist to a surface of a substrate to be processed;

rendering exposure of first layer overlay marks and a first layer circuit pattern to the substrate coated with the photo-resist by using an exposure tool which is fitted up with a first mask;

processing the substrate, which as been rendered with the exposure of the first layer overlay marks and the first layer circuit pattern, to form thereon first layer overlay marks and a first layer circuit pattern;

applying photo-resist to the surface of the substrate on which the first layer overlay marks and the first layer circuit pattern have been formed;

rendering exposure of a second layer overlay marks and a second layer circuit pattern to the substrate coated with the photo-resist by using the exposure tool which is fitted up with a second mask; and processing the substrate, which has been rendered with the exposure of the second layer overlay marks and the second layer circuit pattern, to form thereon second layer overlay marks and a second layer circuit pattern;

wherein said step of rendering the exposure of the second layer overlay mark and the second layer circuit pattern by using the exposure tool fitted up with the second mask includes, beforehand, the steps of calculating a matching error in a circuit pattern area between exposure distortions of first-layer and second-layer circuit pattern areas which are smaller than an exposure field, calculating matching error at overlay mark positions between exposure distortions of first-layer and second-layer overlay mark positions, calculating a modification value which relates both said matching errors, calculating a first exposure condition correction value based on an overlay measurement result which is a result of actual exposure by said second exposure tool by positions with reference to said overlay mark, and modifying said calculated first exposure condition correction value with said modification value to obtain a second exposure condition correction value for rendering the exposure by using said exposure tool.

10. A method of processing a semiconductor device according to claim 9, wherein said step of rendering the exposure of the second overlay mark and the second pattern by using the exposure tool fitted up with the second mask includes further steps of calculating said exposure distortions of first and second circuit pattern areas and said exposure distortions of first and second overlay mark positions based on a first field position error of said exposure field of said first mask, a second field position error of said exposure field of said second mask and product information including data of circuit pattern area coordinate overlay mark positions.

11. A method of processing a semiconductor device comprising the steps of:

applying photo-resist to a surface of a substrate to be processed;

rendering exposure of first layer overlay marks and a first layer circuit pattern to the substrate coated with the photo-resist by using a first exposure tool which is fitted up with a first mask;

processing the substrate, which has been rendered with the exposure of the first layer overlay marks and the first layer circuit pattern, to form thereon first layer overlay marks and a first layer circuit pattern;

applying photo-resist to the surface of the substrate on which the first layer overlay marks and the first layer circuit pattern have been formed;

rendering exposure of second layer overlay marks and a second layer circuit pattern to the substrate coated with the photo-resist by using a second exposure tool which is fitted up with a second mask; and processing the substrate, which has been rendered with the exposure of the second layer overlay marks and the second layer circuit pattern, to form thereon second layer overlay marks and a second layer circuit pattern;

wherein said step of rendering the exposure of the second layer overlay mark and the second layer circuit pattern by using the second exposure too fitted up with the second mask includes, beforehand, the steps of calculating matching error at overlay mark positions between exposure distortions of first-layer an second-layer overlay mark positions being indicated as having a disparity between said first and said second exposure tools or said first and said second masks, calculating a first exposure condition correction value based on an overlay measurement result which is a result of actual exposure by said second exposure tool by positioning with reference to overlay marks, and modifying said calculated first exposure condition correction value by using said calculated matching error at overlay mark positions to obtain a second exposure condition correction value for rendering the exposure by using said second exposure tool.

12. A method for processing a semiconductor device according to claim 11, wherein said exposure condition of the second circuit pattern to be modified in said step of rendering the exposure of the second overlay measurement mark and second circuit pattern by using the second exposure tool fitted up with the second mask includes any of the positional shift, rotation and magnification factor of the second circuit pattern resulting from the rendition of exposure on the surface of the substrate.

13. A method for processing a semiconductor device according to claim 11, wherein said information on the exposure distortion caused by the first exposure tool and information on the exposure distortion caused by the second exposure tool used in said step of rendering the exposure of the second overlay measurement mark and second circuit pattern by using the second exposure tool fitted up with the second mask are stored in a memory in advance.

14. A method for processing a semiconductor device according to claim 11, further including the step of displaying information on the overlay accuracy between the first circuit pattern and the second circuit pattern.

* * * * *